(12) United States Patent
Manepalli et al.

(10) Patent No.: US 10,658,281 B2
(45) Date of Patent: May 19, 2020

(54) INTEGRATED CIRCUIT SUBSTRATE AND METHOD OF MAKING

(71) Applicant: Intel Corporation, Santa Clara, CA (US)

(72) Inventors: Rahul N. Manepalli, Chandler, AZ (US); Kousik Ganesan, Chandler, AZ (US); Marcel Arlan Wall, Phoenix, AZ (US); Srinivas Pietambaram, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,321

(22) Filed: Sep. 29, 2017

(65) Prior Publication Data

US 2019/0103348 A1 Apr. 4, 2019

(51) Int. Cl.
*H05K 7/10* (2006.01)
*H05K 7/12* (2006.01)
(Continued)

(52) U.S. Cl.
CPC .......... *H01L 23/49838* (2013.01); *C25D 3/38* (2013.01); *C25D 5/022* (2013.01); *C25D 7/123* (2013.01); *H01L 21/4846* (2013.01); *H01L 21/4857* (2013.01); *H01L 23/498* (2013.01); *H01L 23/49822* (2013.01); *H01L 23/49866* (2013.01); *H01L 23/49894* (2013.01);
(Continued)

(58) Field of Classification Search
CPC ....... H01L 2224/32225; H01L 2924/00; H01L 2924/00014; H01L 2224/48227; H01L 2224/73265; H01L 2924/15311; H01L 2924/014; H01L 2924/181; H01L 2224/16225; H01L 2224/131; H01L 2224/13101; H01L 2224/73
See application file for complete search history.

(56) References Cited

U.S. PATENT DOCUMENTS 6,370,768 B1* 4/2002 Itabashi ................. H05K 3/422
205/126
2003/0080431 A1 5/2003 Uzoh et al.
(Continued)

FOREIGN PATENT DOCUMENTS

JP 201968054 A 4/2019

OTHER PUBLICATIONS

"European Application Serial No. 18191349.2, Extended European Search Report dated Feb. 12, 2019", 10 pgs.
(Continued)

*Primary Examiner* — Yuriy Semenenko
(74) *Attorney, Agent, or Firm* — Schwegman Lundberg & Woessner, P.A.

(57) ABSTRACT

According to various embodiments of the present disclosure, a substrate for an integrated circuit includes a dielectric layer. The substrate further includes a conductive layer extending in an x or y direction. The conductive layer is at least partially embedded within the dielectric layer. The conductive layer includes a via having a first end and an opposite second end. The via has a first height in a z-direction and a constant cross-sectional shape between the first end and the second end. A trace is adjacent to the via and has a second height in the z-direction that is different than the first height.

5 Claims, 5 Drawing Sheets

(51) Int. Cl.

| | | |
|---|---|---|
| *H01L 23/498* | (2006.01) | |
| *H01L 23/66* | (2006.01) | |
| *H01L 21/48* | (2006.01) | |
| *H01L 23/00* | (2006.01) | |
| *H05K 1/18* | (2006.01) | |
| *H05K 1/11* | (2006.01) | |
| *H05K 1/03* | (2006.01) | |
| *H05K 3/10* | (2006.01) | |
| *C25D 3/38* | (2006.01) | |
| *C25D 5/02* | (2006.01) | |
| *C25D 7/12* | (2006.01) | |

(52) U.S. Cl.
CPC ............ *H01L 23/66* (2013.01); *H01L 24/16* (2013.01); *H05K 1/0306* (2013.01); *H05K 1/0353* (2013.01); *H05K 1/111* (2013.01); *H05K 1/115* (2013.01); *H05K 1/181* (2013.01); *H05K 3/10* (2013.01); *H01L 2223/6616* (2013.01); *H01L 2224/16225* (2013.01); *H01L 2924/18161* (2013.01)

(56) References Cited

U.S. PATENT DOCUMENTS

| | | | |
|---|---|---|---|
| 2010/0101084 A1 | 4/2010 | Guzek et al. | |
| 2014/0332975 A1* | 11/2014 | Raorane | H01L 24/80 257/774 |
| 2015/0028486 A1* | 1/2015 | Liu | H01L 23/48 257/773 |
| 2015/0318236 A1* | 11/2015 | Zhang | H01L 24/16 257/773 |
| 2016/0020165 A1* | 1/2016 | Kamgaing | H01L 21/288 361/679.55 |
| 2016/0247761 A1* | 8/2016 | Song | H01L 23/5227 |
| 2016/0307862 A1* | 10/2016 | Lin | H01L 24/20 |
| 2017/0278700 A1* | 9/2017 | Brooks | H01L 21/02323 |

OTHER PUBLICATIONS

"European Application Serial No. 18191349.2, Response filed Oct. 2, 2019 to Extended European Search Report dated Feb. 12, 2019", 11 pgs.

\* cited by examiner

INTEGRATED CIRCUIT SUBSTRATE AND METHOD OF MAKING

BACKGROUND

In integrated circuits a substrate includes a plurality of traces and vias, which form vertical connections between at least some of the traces. One factor affecting the performance of the circuit is the density of traces in the substrate. However, some substrate manufacturing techniques result in vias and capture pads that limit the achievable density of traces. It is therefore desirable to develop substrates and make substrates that have a high density of traces.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the disclosure, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about" as used herein may allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Figure 1:
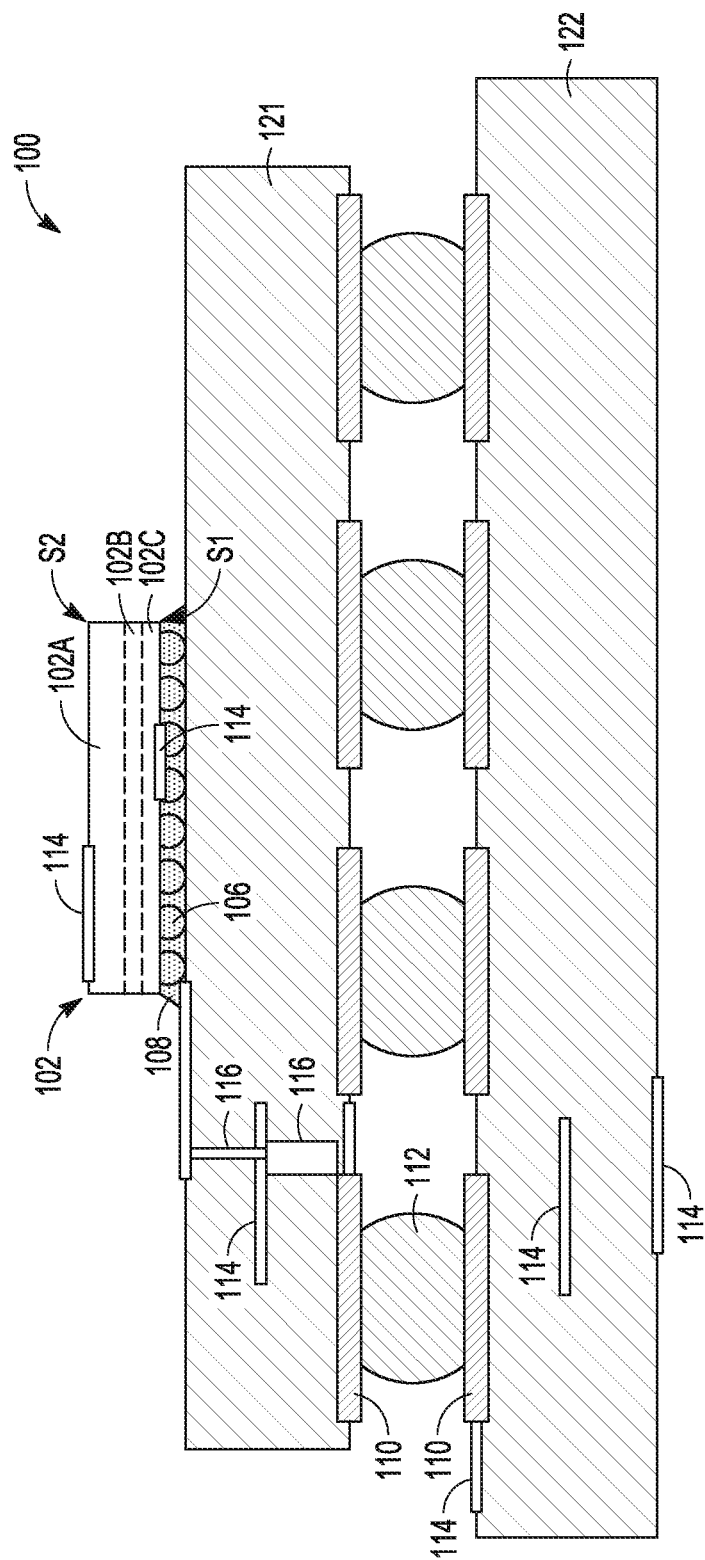
FIG. 1 is a schematic diagram of an integrated circuit package assembly, in accordance with various embodiments.

FIG. 1 schematically illustrates a cross-section side view of an example integrated circuit (IC) package assembly 100, in accordance with some embodiments. In some embodiments, the IC package assembly 100 may include one or more dies (hereinafter "die 102") electrically and/or physically coupled with a package substrate 121. In some embodiments, the package substrate 121 may be electrically coupled with a circuit board 122, as may be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a processor, memory, SoC, or ASIC.

In some embodiments, an underfill material 108 (sometimes referred to as an "encapsulant") may be disposed between the die 102 and the package substrate 121 to promote adhesion and/or protect features of the die 102 and package substrate 121. The underfill material 108 may be composed of an electrically insulative material and may encapsulate at least a portion of the die 102 and/or die-level interconnect structures 106, as may be seen. In some embodiments, the underfill material 108 is in direct contact with the die-level interconnect structures 106.

The die 102 may be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include transistor devices, and an inactive side, S2, may be disposed opposite to the active side S1, as may be seen. Other configurations besides a flip-chip configuration are possible.

Die 102 may generally include a semiconductor substrate 102a, one or more device layers (hereinafter "device layer 102b", and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102. In some embodiments, the die-level interconnect structures 106 may include solder bumps formed according to techniques described herein.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads 110/114, traces 114A and vias 116 disposed on one or more surfaces of the package substrate 121 and/or internal routing features such as, for example, trenches, vias, or other interconnect structures such as traces 114 to route electrical signals through the package substrate 121. For example, in some embodiments, the package substrate 121 may include electrical routing features such as pads (not shown) configured to receive the respective die-level interconnect structures 106 of the die 102.

The circuit hoard 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures 106 such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard.

Package-level interconnects such as, for example, solder balls 112 or bumps may be coupled to one or more pads (hereinafter "pads 110") on the package substrate 121 and/or on the circuit board 122 to form corresponding solder joints that are configured to further route the electrical signals between the package substrate 121 and the circuit board 122. Pads 110 may be composed of any suitable electrically conductive material, such as metal, including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

In some embodiments, circuit board 122 may include one or more traces 114 to route electrical signals on one or more surfaces of the circuit board 122 and/or through the circuit board 122. The one or more traces 114 may include copper traces formed according to techniques described herein, according to various embodiments.

The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

As shown in FIG. 1, conductive elements such as traces 114 are at least partially embedded within the dielectric material. This is shown further in FIG. 2, which is a schematic sectional diagram showing a layer of traces 114 embedded within substrate 121. Substrate 121 may include a suitable build-up dielectric film material, 210, such as Ajinomoto Build-up Film (ABF). Whichever dielectric material is used, it may be an epoxy based resin with a balance material (e.g. epoxy or silica) ranging from about 20 wt % to about 95 wt % of dielectric layer 210, about 90 wt % to about 95 wt % of dielectric layer 210, less than equal to, or greater than about 50 wt %, 55, 60, 65, 70, 75, 80, 85, 90, or 95 wt % of dielectric layer 210. Although shown as a single layer, dielectric layer 210 may include a plurality of individual layers of the dielectric material. In examples where dielectric layer 210 includes a plurality of individual layers, those individual layers of the dielectric material may include different dielectric materials or the same dielectric material.

As described herein, traces 114 include an electrically conductive material such as a metal or an alloy thereof. As shown the conductive material is a metal. The metal may range from about 50 wt % to about 100 wt % of the conductive material, about 95 wt % to about 100 wt % of the conductive material, less than, equal to, or greater than about 50 wt %, 55, 60, 65, 70, 75, 80, 85, 90, 95, or 100 wt % of the conductive material. As shown in FIG. 1, the metal is copper.

Figure 2:
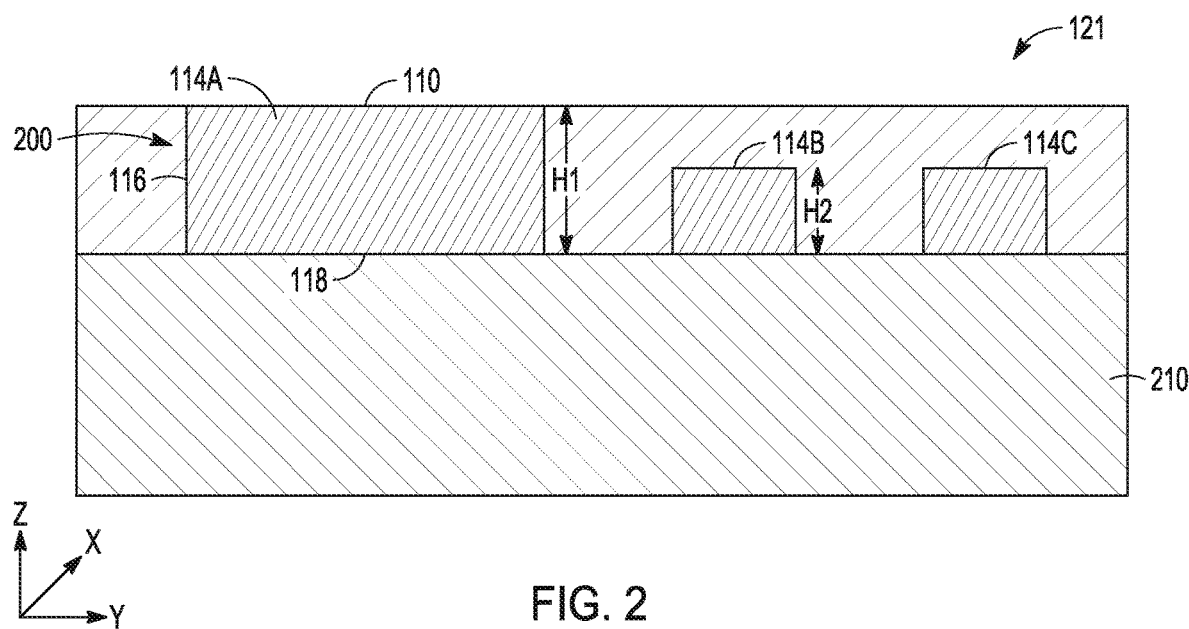
FIG. 2 is a schematic sectional view of a substrate of the integrated circuit package assembly of FIG. 1, in accordance with various embodiments.

FIG. 2 is a schematic sectional view of substrate 121. As shown, substrate 121 includes traces, or metallic transmission lines, 114A, 114B, and 114C. Trace 114A includes a first region which defines via 116 as well as a second region, which carries the electrical signal in the x or y direction. Via 116 projects in the z-direction. Via 116 has first end 118 and second end. Second end may be in electrical communication with another trace (not shown) or a solder ball that is connected to die 102 (not shown).

Figure 3:
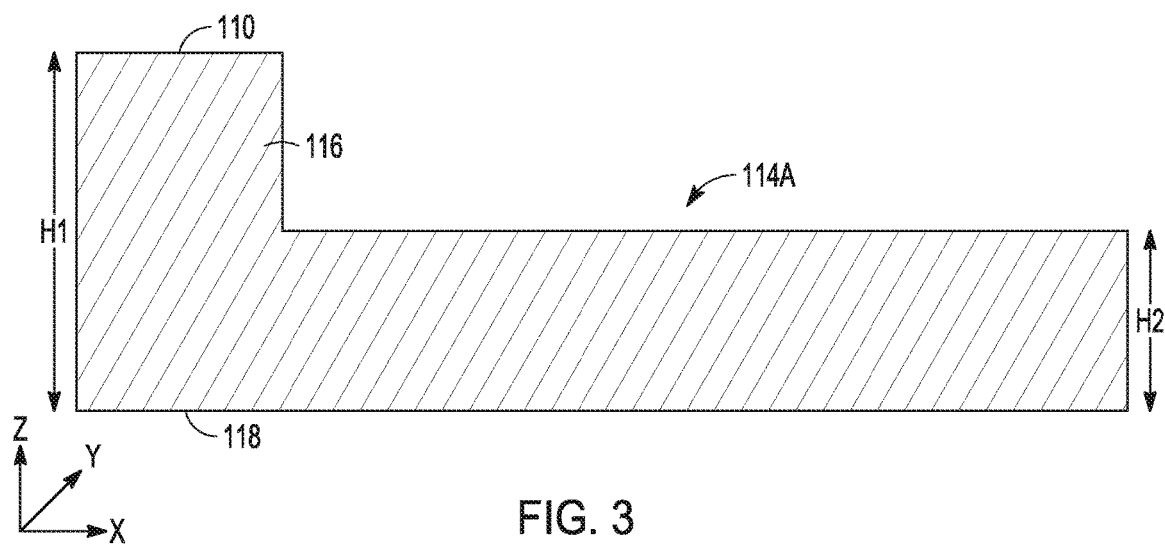
FIG. 3 is a schematic diagram of a transmission line, in accordance with various embodiments.
Figure 4:
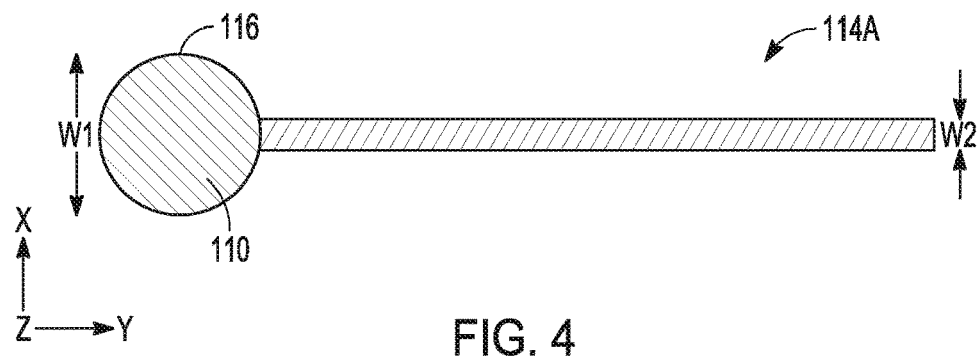
FIG. 4 is a schematic diagram of the transmission line of FIG. 3 viewed from the top, in accordance with various embodiments.

FIG. 3 is a schematic side view of trace 114A isolated from dielectric layer 210 and rotated 90 degrees with respect to FIG. 1. FIG. 4 is a schematic top view of transmission line 114A. As shown in FIGS. 2-4, via 116 and traces 114A, 114B, or 114C have different z-direction heights and x or y direction widths. For example, as shown with respect to FIG. 2, via 116 has first height $H_1$. Trace 114B, which is adjacent via 116, has a second height $H_2$ which is different than the first height. A second region of trace 114A, shown in FIGS. 3 and 4, has a height substantially equivalent to second height $H_2$. While not so limited, the first height may range from about 2 μm to about 30 μm, about 15 μm to about 20 μm, less than, equal to, or greater than about 2 μm, 3, 4, 5, 6, 7, 8, 9, 10, 11, 12, 13, 14, 15, 16, 17, 18, 19, 20, 21, 22, 23, 24, 25, 26, 27, 28, 29, or 30 μm. While not so limited, the second height may range from 2 μm to about 15 μm, about 8 μm to about 13 μm, less than, equal to, or greater than about 2 μm, 3, 4, 5, 6, 7, 8, 9, 10, 11, 12, 13, 14, or 15 μm. As compared to each other, the first height may range from about 1.5 times to about 4 times greater than the second height, about 2 times to about 4 times greater than the second height, less than, equal to, or greater than about 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0 times greater than the second height.

While not so limited, a first width $W_1$ of via 116 in an x or y direction may range from about 15 μm to about 40 μm, about 25 μm to about 35 μm, less than, equal to, or greater than about 15 μm, 16, 17, 18, 19, 20, 21, 22, 23, 24, 25, 26, 27, 28, 29, 30, 31, 32, 33, 34, 35, 36, 37, 38, 39, or 40 μm. Additionally, while not so limited, a second width $W_2$ in an x or y direction of adjacent trace 114B, or second region of trace 114A, may range from about 2 μm to about 20 μm, about 11 μm to about 15 μm, less than, equal to, or greater than about 2 μm, 3, 4, 5, 6, 7, 8, 9, 10, 11, 12, 13, 14, 15, 16, 17, 18, 19, or 20 μm. As compared to each other, the first width may range from about 1.5 times to about 4 times greater than the second width, about 2 times to about 4 times greater than the second width, less than, equal to, or greater than about 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0 times greater than the second width. Via 116 may be connected to a trace of a second conductive layer.

As shown in FIGS. 2, 3, and 4, via 116 has a constant cross-sectional shape. The shape may be any suitable shape. Non-limiting examples of suitable shapes include a circle, an oval, a triangle, a square, a rectangle, a pentagon, a hexagon, a heptagon, and an octagon. Regardless of the choice of shape, via 116 via has a substantially non-tapered profile in a z-direction. The non-tapered profile may result from dielectric layer 210 not being laser drilled in order to form via 116. This may lead to several benefits in that via 116 may be a "self-aligned via". As used herein the term "self-aligned via" refers to a via that is not positioned on a via capture pad having a diameter larger than the via. As generally understood in some substrate manufacturing methods, where a via is laser drilled or even lithographically defined, a capture pad is formed so that the via may fully land on the pad to accommodate laser/litho alignment tolerances. In some non-limiting examples, the capture pad may have to be 25 μm to 30 μm larger than the minimum diameter of the via. However, because vias 116 have a constant cross-sectional shape and are not formed through a method involving laser drilling or lithographic patterning, there is no need for a capture pad that is larger than a minimum diameter of via 116. Thus, where via 116 is located, the minimum diameter of via 116 is the same as the diameter or width of trace 114. To the extent that any portion of via 116 may be considered to include a portion functioning as a capture pad, there is no interface therebetween. Thus via 116 is a monolithic structure.

Figure 5:
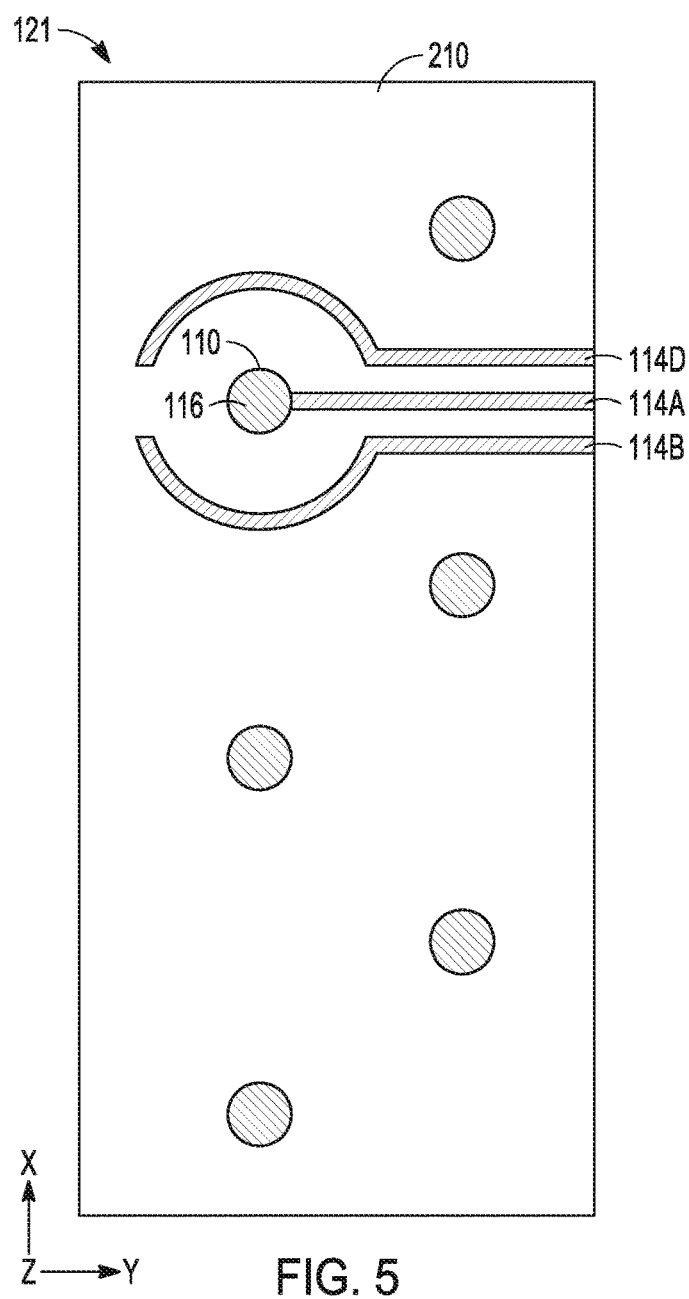
FIG. 5 is a schematic diagram of the transmission line of FIG. 4 located within a substrate, in accordance with various embodiments.
Figure 6:
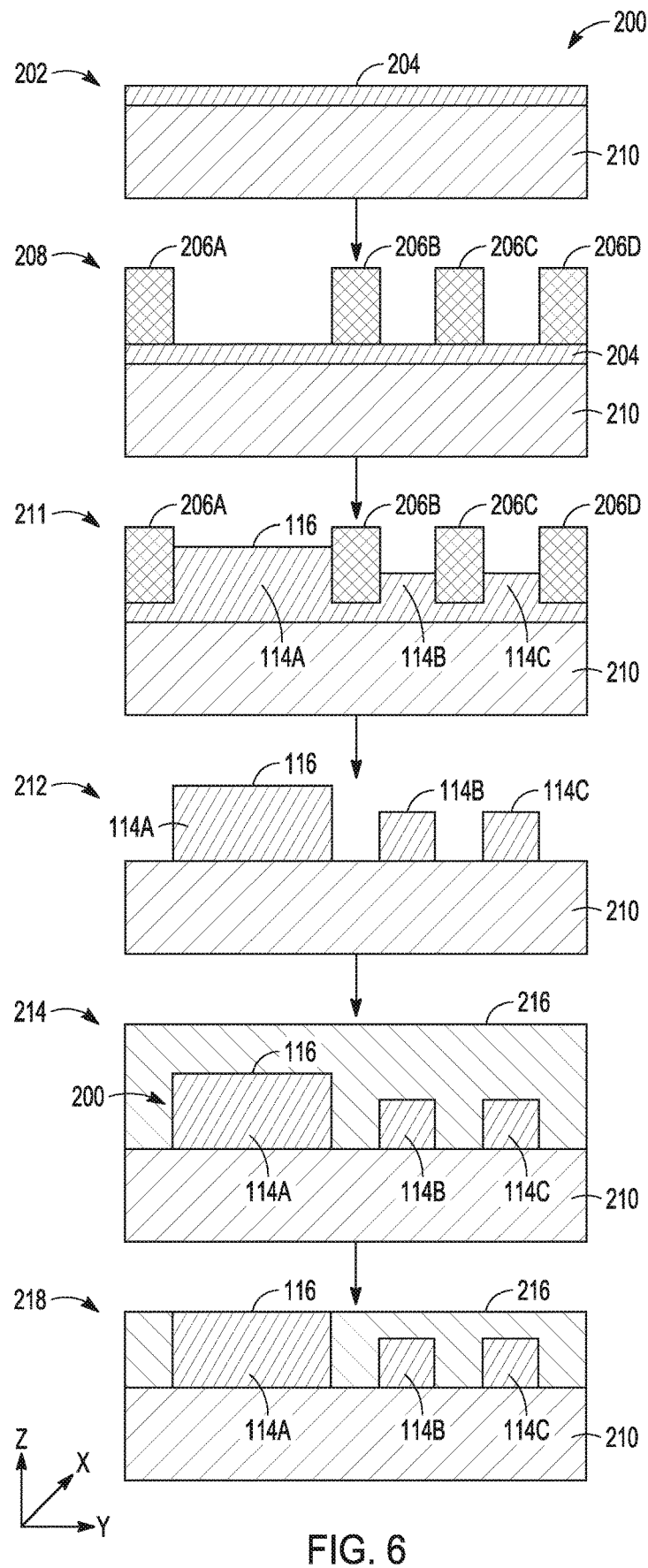
FIG. 6 is a schematic diagram illustrating a method of making the substrate of FIG. 2, in accordance with various embodiments.

In some embodiments this may be beneficial in that substrate 121 may have an increased density of traces as compared to a corresponding substrate having a via capture pad. As an example, FIG. 5 shows a top sectional view of substrate 121. As shown, traces 114B and 114D divert around via 116. Without an oversized via capture pad, traces 114B and 114D may be much closer to via 116, thereby opening up additional space for additional traces 114. Thus more traces 114, and thereby increased input/output density, may be present in substrate 121. FIG. 6 is a schematic diagram illustrating method 200 of forming substrate 121. In operation 202, an electrolytic copper layer which acts as a seed layer for subsequent electroplated copper traces and vias is formed on the dielectric layer 210. In some embodiments, the seed layer may be sputtered. After seed layer including electrolytic copper composition 204 is deposited on dielectric layer 210, a dry film resist that is photo-definable is formed on the seed layer which is then patterned using a lithography process to define the openings on including electrolytic copper composition 204 at operation 208. In some embodiments, the DFR portions 206A-206D may be laminated, deposited, etched, and/or formed according to some other process. In some embodiments, the DFR portions 206A-206D may be laminated onto the seed layer, then masked and photo-defined. Pads 114A, vias 116 and traces 114B-114C are then formed in the DFR openings. In embodiments, the pads, vias and traces may be formed via a plating process such as electrolytic plating. In embodiments, the Pads 114A, vias 116 and traces 114B-114C may be formed from copper. In some embodiments, the Pads 114A, vias 116 and traces 114B-114C may be formed from the same material or a different material from the including electrolytic copper composition 204.

The growth of vias 116 having a first height $h_1$ as opposed to traces 114 having second height $h_2$, may be accomplished by controlling the electrolytic bath components and maintaining adjacent dry film resist elements 206 dispersed on the including electrolytic copper composition 204 at specific distances and with respect to each other. Electroplated copper that forms the pads 114A, vias 116 and traces 114B-114C is deposited from a bath that has a source for Cu, which may include any suitable mixture of components dispersed or dissolved in water. For example, electrolytic copper composition 204 may include a copper salt. While not so limited, the copper salt may range from about 20 wt % to about 70 wt % of electrolytic copper composition 204, about 50 wt % to about 60 wt %, less than, equal to, or greater than about 20 wt %, 25, 30, 35, 40, 45, 50, 55, 60, 65, 70 wt % of electrolytic copper composition 204. Non-limiting examples of the copper salt include cupric sulfate, copper chloride, or a mixture thereof.

including electrolytic copper composition 204 may further include a rate controlling agent such as an accelerator or suppressor. The rate controlling agent may range from about 20 wt % to about 70 wt % of electrolytic copper composition 204, less than, equal to, or greater than about 20 wt %, 25, 30, 35, 40, 45, 50, 55, 60, 65, 70 wt % of electrolytic copper composition 204. The rate controlling additive may include one or more compounds that are capable of suppressing the deposition rate of copper metal in certain portions of the substrate while increasing the deposition rate of the copper metal in other portions of the substrate. This may be necessary to fill high aspect ratio features. For example, a bottom-up fill process (also known as superfill) may be used to fill high-aspect features by suppressing the copper deposition rate at the surface of the substrate (often referred to as the "field"), while simultaneously increasing the copper deposition rate within the narrow trenches and vias.

In some examples, certain rate controlling additives may function to both increase the copper deposition rate within the features while suppressing the copper deposition rate on the field. For instance, certain polymeric additives, such as PEG, may become anchored to the field by techniques that are well known in the art, such as the use of a metal catalyst as an anchoring agent. The anchored polymeric additive substantially prevents copper from depositing on at least portions of the field, thereby suppressing the copper deposition rate at the surface of the substrate. Suppressing metal deposition on the field forces the metal to travel down into the narrow trenches where the metal deposits and fills the gap. The polymeric additive generally does not inhibit metal deposition within the features, such as the narrow trenches and vias, because the size of the high molecular weight polymer substantially prevents it from entering such features. The polymeric additive therefore increases copper deposition within the features by suppressing copper deposition on the top surface.

In some examples, certain rate controlling additives may be used to suppress the copper deposition rate in areas while other rate controlling additives may be used to increase the copper deposition rate in other areas. For instance, rate controlling additives that may be used to suppress the copper deposition rate on the field include, but are not limited to, polyethers such as polyethylene glycol (PEG), polypropylene glycol (PPG), nitrogen bearing heterocyclic or non-heterocyclic aromatic compounds, large molecular weight polyoxy-alkyl type compounds, and other high molecular weight polymers. Furthermore, rate controlling additives that may be used primarily to increase the copper deposition rate within high-aspect features include, but are not limited to, sulfur-based organic molecules such as bis (sodiumsulfopropyl) disulfide (SPS), other disulfides, and surfactants.

In some examples, a high molecular weight polymer may be used as a grain refining additive as well as a rate controlling additive. For instance, in some implementations, PEG may be used as both a grain refining additive and a rate controlling additive.

In addition to promoting superfill, the use of rate controlling additives allows the nucleation time to be controlled without having to rely on adjustments to the pH level and/or temperature of the electrolytic plating bath, as is done in conventional processes.

Electrolytic copper composition 204 may further include a grain refining additive. The grain refining additive may range from about 5 wt % to about 50 wt % of electrolytic copper composition 204, about 10 wt % to about 20 wt %, less than, equal to, or greater than about 5 wt %, 10, 15, 20, 25, 30, 35, 40, 45, or 50 wt % of electrolytic copper composition 204. The grain refining additive may be a high molecular weight compound that is capable of reducing the grain size of the plated copper metal. By reducing the grain size of the copper, the copper metal may more readily enter high aspect features and reach the bottom of the features while minimizing issues such as obstructing the trench gap or forming a trench overhang. In implementations of the inventive subject matter, materials that may be used as the grain refining additive include, but are not limited to, polyethylene glycol (PEG), ethylene diamine, propionitrile (also known as ethyl cyanide), and ethylene glycol (EG). Some of these materials may be available in polymeric form, such as PEG, which may be available as PEG 2000, PEG 4000, PEG 6000, etc. In accordance with implementations of the disclosure, the grain refining additive may have a molecular weight that ranges from 1,000 to 10,000. As will be appreciated by those of skill in the art, alternative high molecular weight compounds capable of reducing the grain size of the plated copper metal may be used.

In some examples, electrolytic copper composition 204 may further include a buffering agent. The buffering agent may range from about 5 wt % to about 50 wt % of electrolytic copper composition 204, about 10 wt % to about 20 wt %, less than, equal to, or greater than about 5 wt %, 10, 15, 20, 25, 30, 35, 40, 45, or 50 wt % of electrolytic copper composition 204. In embodiments of the invention, buffering agents that may be used include ethylene diamine tetraacetic acid (EDTA), hydroxyethylene diamine triacetic acid (HEDTA), Rochelle salt (also known as potassium sodium tartarate), an organic acid (e.g., citric acid, tartaric acid, etc.), ammonium citrate, lactate, triethanolamine (TEA), and ethylene diamine. Alternate buffering agents not mentioned here may be used as well.

In some examples, electrolytic copper composition 204 may further include a bath stabilizing agent. The bath stabilizing agent ranges from about 5 wt % to about 50 wt % of electrolytic copper composition 204, 10 wt % to about 20 wt % of the electrolytic copper composition 204, less than, equal to, or greater than about 5 wt %, 10, 15, 20, 25, 30, 35, 40, 45, or 50 wt % of electrolytic copper composition 204. In some examples, the bath stabilizing agent may include one or more compounds that are capable of stabilizing the bath against the formation of undesired cuprous oxide particles for electrolytic plating processes having relatively long nucleation times. The long nucleation times help to completely fill features with high aspect ratios. In some implementations, the bath stabilizing agent may further function as a leveling agent to produce mirror-like plated surfaces. In some examples, bath stabilizing agents that may be used include, but are not limited to, thiourea, dypiridil, mercaptobenzothiazole (MBT), benzotriazole, Janus Green B (JGB), cyanide, vanadium pentoxide ($V_2O_5$), as well as certain high molecular weight polymers.

As discussed herein, the growth of vias 116 having a first height $H_1$ as opposed to traces 114 having second height $h_2$, may be accomplished by controlling the electrolytic bath components and maintaining adjacent dry film resist elements 206 dispersed on the seed layer 204 at specific distances and with respect to each other to form patterned regions. For example as shown, dry film resist elements 206A and 206B are spaced apart at a first distance $d_1$ and dry film resist elements 206A and 206C are spaced apart at a second distance $d_2$. The first distance is greater than the second distance. As non-limiting examples, the first distance may range from about 15 μm to about 40 μm, about 25 μm to about 35 μm, less than, equal to, or greater than about 15 μm, 20, 25, 30, 35, or 40 μm. The second distance may range from about 2 μm to about 20 μm, about 11 μm to about 15 μm, less than, equal to, or greater than about 2 μm, 5, 10, 15, or 20 μm. $D_1$ may also be about 1.25 times to about 10 times greater than $D_2$, about 3 times greater to about 6 times greater, or less than, equal to, or greater than about 1.25, 1.50, 1.75, 2, 2.25, 2.50, 2.75, 3, 3.25, 3.5, 3.75, 4, 4.25, 4.50, 4.75, 5, 5.25, 5.5, 5.75, 6, 6.25, 6.50, 6.75, 7, 7.25, 7.50, 7.75, 8, 8.25, 8.50, 8.75, 9, 9.25, 9.50, 9.75, or 10 times greater than $D_2$. It is understood that the distance between dry film resist elements 206A and 206B may vary along the x- or y-direction depending on whether it is desired to form a via. The distance between dry film resist elements 206B and 206C may vary similarly.

At operation 211, the Pads (114A), vias 116 and traces 114B-114C are electroplated applying voltage thereto. The distance between dry film resist elements 206 may determine, at least in part, whether a high aspect ratio via 116 or lower aspect ratio trace 114 is formed. Greater distances between dry film resist elements 206 may result in higher aspect ratio (height to width) features such as vias 116, whereas comparatively smaller distances between dry film resist elements 206 may result in lower aspect ratio (height to width) features of trace 114.

Moreover, electrolytic bath copper composition may be altered in terms of the amount of inhibitor or accelerator to produce desired heights for the Pads (114A), vias 116 and traces (114B-114C). Without intending to be bound to any theories, the inventors believe that the inclusion of predetermined levels of rate controlling agents may selectively produce an inhibitor in a space having a limited area, which may result in slower plating in smaller areas than larger areas. For example, and without limitation, the inventors have found that differential growth rates leading to taller vias and shorter traces due to the presence of a by-product of a rate control agent such as an accelerator by-product, which acts as a plating inhibitor. Even if less of the rate controlling agent is present, due to a lack of efficient circulation in a relatively narrow space (e.g., a 13 µm wide space), a lower aspect ratio (height to width) trace will form. Contrarily, due the relatively more efficient circulation in a comparatively wider space (e.g., a 25 µm wide space) the inhibiter by-product will be more efficiently circulated, and therefore less effective, leading to the formation of higher aspect ratio (height to width) vias during plating, even if more of the rate controlling agent is present.

Thus a different rate in plating may exist between dry film resist elements 206A and 206B than between 206B and 206C. Accordingly, electrolytic plating in a first region defined between dry film resist elements 206A and 206B may occur at a faster rate than electrolytic plating in a second region defined between dry film resist elements 206B and 206C.

At operation 212, dry film resist elements 206A-206D are removed. Via 116 and traces 114A, 114B and 114C are optionally roughed or an adhesion promoter is applied thereto. At operation 214, second dielectric layer 216 is laminated over via 116 and traces 114. At operation 218, any excess dielectric material of the second dielectric layer 216 is removed for the subsequent routing layer formation. The removal of the dielectric material may be accomplished by etching (physical or chemical), grinding, or Chemical Mechanical Polish (CMP). Excess dielectric material may refer to dielectric material extending in a z-direction beyond trace 114A. The operations of method 200 may be repeated to form additional vias 116 and traces.

Figure 7:
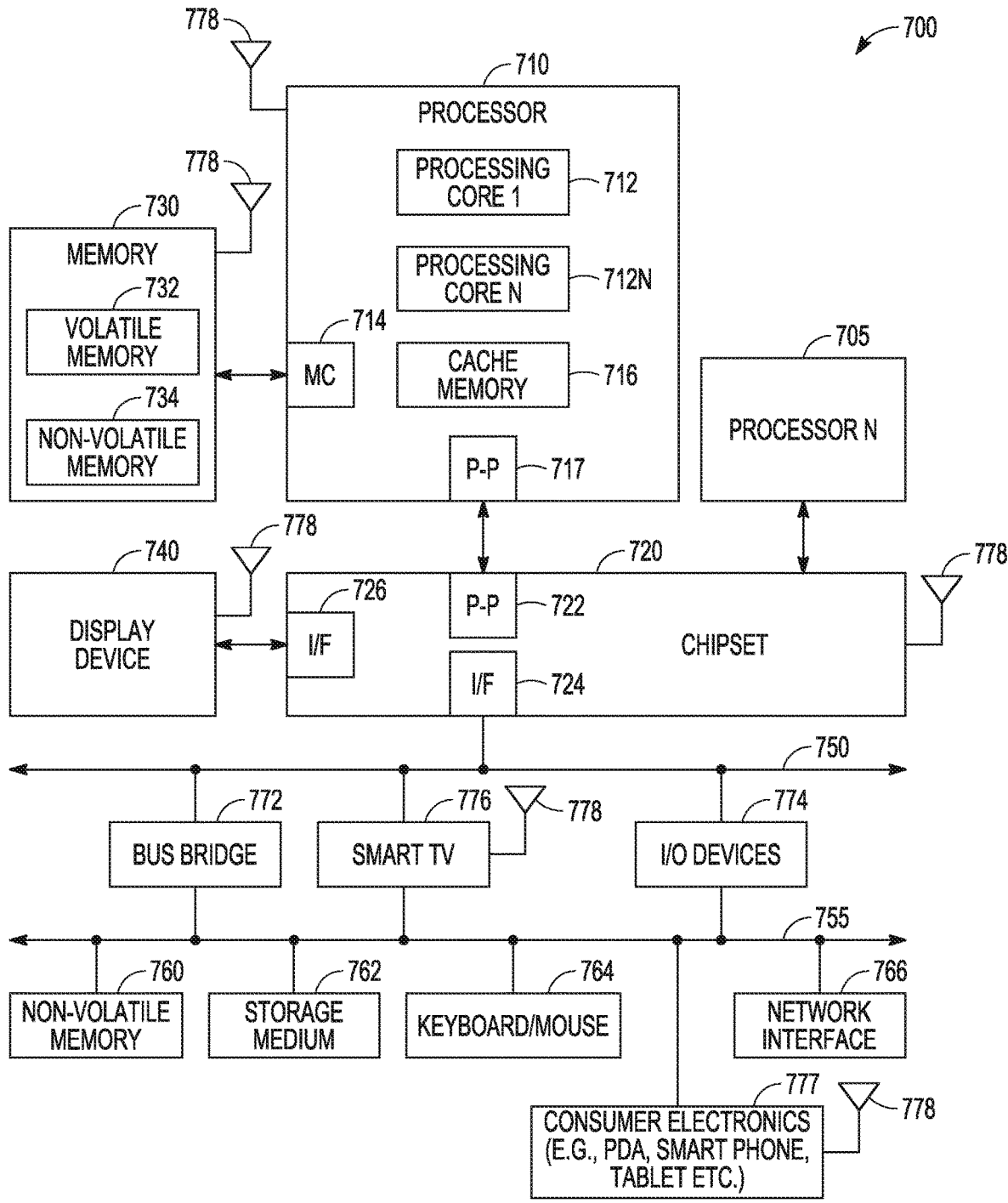
FIG. 7 is block diagram of an electronic system, in accordance with various embodiments.

FIG. 7 illustrates a system level diagram, according to an embodiment of the invention. For instance, FIG. 7 depicts an example of an electronic device (e.g., system) including IC package assembly 100; FIG. 7 is included to show an example of a higher level device application for the present inventive subject matter. In an embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In an embodiment, processor 710 has one or more processing cores 712 and 712N, where 712N represents the Nth processor core inside processor 710 where N is a positive integer. In an embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions, and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In an embodiment, the wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In an embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect ((QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Chipset 720 may also be coupled to a wireless antenna 778 to communicate with any device configured to transmit and/or receive wireless signals.

Chipset 720 connects to display device 740 via interface 726. Display device 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In an embodiment, chipset 720 couples with a non-volatile memory 760, a mass storage device(s) 762, a keyboard/mouse 764, and a network interface 766 via interface 724 and/or 726, smart TV 776, consumer electronics 777, etc.

In an embodiment, mass storage device 762 includes, but is not limited to, a solid state drive, a hard disk drive, a universal serial bus flash memory drive, or any other form of computer data storage medium. In an embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of cache memory 716) may be incorporated into processing core 712.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present disclosure. Thus, it should be understood that although the present disclosure has been specifically disclosed by specific embodiments and optional features, modification and variation of the concepts herein disclosed may be resorted to by those of ordinary skill in the art, and that such modifications and variations are considered to be within the scope of embodiments of the present disclosure.

Additional Embodiments

The following exemplary embodiments are provided, the numbering of which is not to be construed as designating levels of importance:

Embodiment 1 provides a substrate for an integrated circuit, the substrate comprising:
 a dielectric layer; and
 a conductive layer extending in an x or y direction and at least partially embedded within the dielectric layer, the conductive layer comprising:
  a via having a first end and an opposite second end, wherein the via has a first height in a z-direction and a constant cross-sectional shape between the first end and the second end; and
  a trace adjacent to the via and having a second height in the z-direction that is different than the first height.

Embodiment 2 provides the substrate of Embodiment 1, wherein the dielectric layer comprises a dielectric material.

Embodiment 3 provides the substrate of Embodiment 2, wherein the dielectric material ranges from about 20 wt % to about 100 wt % of the dielectric layer.

Embodiment 4 provides the substrate of any one of Embodiments 1 or 3, wherein the dielectric material ranges from about 95 wt % to about 100 wt % of the dielectric layer.

Embodiment 5 provides the substrate of any one of Embodiments 1-4, wherein the dielectric material is chosen from an epoxy laminate, polytetrafluoroethylene, phenolic cotton paper, woven glass, or mixtures thereof.

Embodiment 6 provides the substrate of any one of Embodiments 1-5, wherein the dielectric layer comprises a plurality of individual layers of the dielectric material.

Embodiment 7 provides the substrate of Embodiment 6, wherein the individual layers of the dielectric material comprise different dielectric materials.

Embodiment 8 provides the substrate of Embodiment 6, wherein the individual layers of the dielectric material comprise the same dielectric material.

Embodiment 9 provides the substrate of any one of Embodiments 1-8, wherein the conductive layer includes a metal.

Embodiment 10 provides the substrate of Embodiment 9, wherein the metal ranges from about 50 wt % to about 100 wt % of the conductive layer.

Embodiment 11 provides the substrate of any one of Embodiments 9 or 10, wherein the metal ranges from about 95 wt % to about 100 wt % of the conductive layer.

Embodiment 12 provides the substrate of any one of Embodiments 9-11, wherein the metal is copper.

Embodiment 13 provides the substrate of any one of Embodiments 1-12, wherein the constant cross-sectional shape is chosen from a circle, an oval, a triangle, a square, a rectangle, a pentagon, a hexagon, a heptagon, and an octagon.

Embodiment 14 provides the substrate of any one of Embodiments 1-13, wherein the via has a substantially a substantially constant width.

Embodiment 15 provides the substrate of any one of Embodiments 1-14, wherein the first height ranges from about 2 μm to about 30 μm.

Embodiment 16 provides the substrate of any one of Embodiments 1-15, wherein the first height ranges from about 15 μm to about 20 μm.

Embodiment 17 provides the substrate of any one of Embodiments 1-16, wherein a width of the via in an x or y direction ranges from about 15 μm to about 40 μm.

Embodiment 18 provides the substrate of any one of Embodiments 1-17, wherein a width of the via in an x or y direction ranges from about 25 μm to about 35 μm.

Embodiment 19 provides the substrate of any one of Embodiments 1-18, wherein the second height ranges from about 2 μm to about 15 μm.

Embodiment 20 provides the substrate of any one of Embodiments 1-19, wherein the second height ranges from about 8 μm to about 13 μm.

Embodiment 21 provides the substrate of any one of Embodiments 1-20, wherein a width of the trace in an x or y direction ranges from about 2 μm to about 20 μm.

Embodiment 22 provides the substrate of any one of Embodiments 1-21, wherein a width of the trace in an x or y direction ranges from about 11 μm to about 15 μm.

Embodiment 23 provides the substrate of any one of Embodiments 1-22, wherein the first height ranges from about 1.5 times to about 4 times greater than the second height.

Embodiment 24 provides the substrate of any one of Embodiments 1-23, wherein a width of the via ranges from about 1.5 times to about 4 times greater than a width of the trace.

Embodiment 25 provides the substrate of any one of Embodiments 1-24, further comprising a second conductive layer comprising a second trace coupled to the via.

Embodiment 26 provides a substrate for an integrated circuit, the substrate comprising:
  a dielectric layer;
  a metallic transmission line, comprising:
    a first region having a first width in an x or y direction and a first height in a z-direction; and
    a second region having a second width in the x or y direction and a second height in the z-direction,
    wherein the first height is greater than the second height and the first region has a constant cross-sectional shape in the z-direction.

Embodiment 27 provides the substrate of Embodiment 26, wherein the dielectric layer comprises a dielectric material.

Embodiment 28 provides the substrate of Embodiment 27, wherein the dielectric material ranges from about 20 wt % to about 100 wt % of the dielectric layer.

Embodiment 29 provides the substrate of any one of Embodiments 27 or 28, wherein the dielectric material ranges from about 95 wt % to about 100 wt % of the dielectric layer.

Embodiment 30 provides the substrate of any one of Embodiments 26-29, wherein the dielectric material is chosen from an epoxy laminate, polytetrafluoroethylene, phenolic cotton pater, woven glass, or mixtures thereof.

Embodiment 31 provides the substrate of any one of Embodiments 26-30, wherein the dielectric layer comprises a plurality of individual layers of the dielectric material.

Embodiment 32 provides the substrate of Embodiment 31, wherein the individual layers of the dielectric material comprise different dielectric materials.

Embodiment 33 provides the substrate of Embodiment 31, wherein the individual layers of the dielectric material comprise the same dielectric material.

Embodiment 34 provides the substrate of any one of Embodiments 26-32, wherein the conductive layer includes a metal.

Embodiment 35 provides the substrate of Embodiment 34, wherein the metal ranges from about 50 wt % to about 100 wt % of the conductive layer.

Embodiment 36 provides the substrate of any one of Embodiments 34 or 35, wherein the metal ranges from about 95 wt % to about 100 wt % of the conductive layer.

Embodiment 37 provides the substrate of any one of Embodiments 34-36, wherein the metal is copper.

Embodiment 38 provides the substrate of any one of Embodiments 26-37, wherein the constant cross-sectional shape is chosen from a circle, an oval, a triangle, a square, a rectangle, a pentagon, a hexagon, a heptagon, and an octagon.

Embodiment 39 provides the substrate of any one of Embodiments 26-38, wherein the first region has a substantially non-tapered profile.

Embodiment 40 provides the substrate of any one of Embodiments 26-39, wherein the first height ranges from about 2 µm to about 30 µm.

Embodiment 41 provides the substrate of any one of Embodiments 26-40, wherein the first height ranges from about 15 µm to about 20 µm.

Embodiment 42 provides the substrate of any one of Embodiments 26-41, wherein a width of the first region in an x or y direction ranges from about 15 µm to about 40 µm.

Embodiment 43 provides the substrate of any one of Embodiments 26-42, wherein a width of the first region in an x or y direction ranges from about 25 µm to about 35 µm.

Embodiment 44 provides the substrate of any one of Embodiments 26-43, wherein the second height ranges from about 2 µm to about 15 µm.

Embodiment 45 provides the substrate of any one of Embodiments 26-44, wherein the second height ranges from about 8 µm to about 13 µm.

Embodiment 46 provides the substrate of any one of Embodiments 26-45, wherein a width of the second region in an x or y direction ranges from about 2 µm to about 20 µm.

Embodiment 47 provides the substrate of any one of Embodiments 26-46, wherein a width of the second region in an x or y direction ranges from about 11 µm to about 15 µm.

Embodiment 48 provides the substrate of any one of Embodiments 26-47, wherein the first height ranges from about 1.5 times to about 4 times greater than the second height.

Embodiment 49 provides the substrate of any one of Embodiments 26-48, wherein a width of the first region ranges from about 1.5 times to about 4 times greater than a width of the second region.

Embodiment 50 provides the substrate of any one of Embodiments 26-49, wherein the first region is a via and the second region is a trace.

Embodiment 51 provides a method for forming a substrate, the method comprising:
  contacting a first patterned region with an electrolytic copper composition comprising:
    a copper salt; and
    a rate controlling agent;
  contacting a second patterned region with the electrolytic copper composition comprising:
    a copper salt; and
    a rate controlling agent;
  wherein a first quantity of the rate controlling agent in the first region differs from second quantity of the rate controlling agent in the second region and the first and second regions are defined by plurality of dry film resist elements, wherein a first distance in an x or y direction in the first region between a first pair of adjacent dry film resist elements is greater than a second distance in the x or y direction in the second region between a second pair of adjacent dry film resist elements;
  applying a voltage to the electrolytic copper composition to plate a copper layer in the patterned regions;
  removing the dry film resist elements; and
  laminating a second dielectric layer on the copper layer.

Embodiment 52 provides the method of Embodiment 51, wherein the copper salt ranges from about 20 wt % to about 70 wt % of the electrolytic copper composition.

Embodiment 53 provides the method of any one of Embodiments 51 or 52, wherein the copper salt ranges from about 50 wt % to about 60 wt % of the electrolytic copper composition.

Embodiment 54 provides the method of any one of Embodiments 51-53, wherein the copper salt is chosen from cupric sulfate, copper chloride, or a mixture thereof.

Embodiment 55 provides the method of any one of Embodiments 51-54, wherein the rate controlling agent ranges from about 20 wt % to about 70 wt % of the electrolytic copper composition.

Embodiment 56 provides the method of any one of Embodiments 51 or 55, wherein the rate controlling agent ranges from about 50 wt % to about 60 wt % of the electrolytic copper composition.

Embodiment 57 provides the method of any one of Embodiments 51-56, wherein the rate controlling agent is chosen from polyethers, polyethylene glycol, polypropylene glycol, nitrogen bearing heterocyclic aromatic compounds, nitrogen bearing non-heterocyclic aromatic compounds, large molecular weight polyoxy-alkyl type compounds, high molecular weight polymers, sulfur-based organic molecules, SPS, disulfides, and surfactants.

Embodiment 58 provides the method of any one of Embodiments 51-57, wherein the electrolytic copper composition further comprises a grain refining additive.

Embodiment 59 provides the method of Embodiment 58, wherein the grain refining additive ranges from about 5 wt % to about 50 wt % of the electrolytic copper composition.

Embodiment 60 provides the method of any one of Embodiments 58 or 59, wherein the grain refining additive ranges from about 10 wt % to about 20 wt % of the electrolytic copper composition.

Embodiment 61 provides the method of any one of Embodiments 58-60, wherein the grain refining additive is chosen from polyethylene glycol, ethylene diamine, propionitrile, ethylene glycol, or a mixture thereof.

Embodiment 62 provides the method of any one of Embodiments 51-61, wherein the electrolytic copper composition further comprises a buffering agent.

Embodiment 63 provides the method of Embodiment 62, wherein the buffering agent ranges from about 5 wt % to about 50 wt % of the electrolytic copper composition.

Embodiment 64 provides the method of any one of Embodiments 62 or 63, wherein the buffering agent ranges from about 10 wt % to about 20 wt % of the electrolytic copper composition.

Embodiment 65 provides the method of Embodiment 62-64, wherein the buffering agent is chosen from ethylene diamine tetraacetic acid, hydroxyethylene diamine triacetic acid, potassium sodium tartarate, an organic acid, ammonium citrate, lactate, triethanolamine, ethylene diamine, or a mixture thereof.

Embodiment 66 provides the method of Embodiment 65, wherein the organic acid is chosen from citric acid, tartaric acid, or a mixture thereof.

Embodiment 67 provides the method of Embodiment 51-66, wherein the electrolytic copper composition thither comprises a bath stabilizing agent.

Embodiment 68 provides the method of Embodiment 67, wherein the bath stabilizing agent ranges from about 5 wt % to about 50 wt % of the electrolytic copper composition.

Embodiment 69 provides the method of any one of Embodiments 67 or 68, wherein the bath stabilizing agent ranges from about 10 wt % to about 20 wt % of the electrolytic copper composition.

Embodiment 70 provides the method of any one of Embodiments 67-69, wherein the bath stabilizing agent is chosen from thiourea, dypiridil, mercaptobenzothiazole, benzotriazole, cyanide, $V_2O_5$, or a mixture thereof.

Embodiment 71 provides the method of any one of Embodiments 51-70, wherein the first distance ranges from about 15 µm to about 40 µm.

Embodiment 72 provides the method of any one of Embodiments 51-71, wherein the first distance ranges from about 25 µm to about 35 µm.

Embodiment 73 provides the method of any one of Embodiments 51-72, wherein the second distance ranges from about 2 µm to about 20 µm.

Embodiment 74 provides the method of any one of Embodiments 51-73, wherein the second distance ranges from about 11 µm to about 15 µm.

Embodiment 75 provides the method of any one of Embodiments 51-74, wherein plating the electrolytic copper composition in the first patterned region occurs at a faster rate than plating the electrolytic copper composition in the second patterned region.

Embodiment 76 provides the method of any one of Embodiments 51-75, further comprising removing the dry film resist elements.

Embodiment 77 provides the method of any one of Embodiments 51-76, further comprising roughening at least a portion of the copper layer.

Embodiment 78 provides the method of any one of Embodiments 51-77, further comprising forming an adhesion promoting layer over at least a portion of the copper layer.

Embodiment 79 provides the method of any one of Embodiments 51-78, wherein a first portion of the copper layer formed in the first patterned region has a first height and a second portion of the copper layer formed in the second patterned region has a second height that is different than the first height.

Embodiment 80 provides the method of Embodiment 79, wherein the first height ranges from about 2 µm to about 30 µm.

Embodiment 81 provides the method of any one of Embodiments 79 or 80, wherein the first height ranges from about 15 µm to about 20 µm.

Embodiment 82 provides the method of any one of Embodiments 79-81, wherein the second height ranges from about 2 µm to about 15 µm.

Embodiment 83 provides the method of any one of Embodiments 79-82, wherein the second height ranges from about 8 µm to about 13 µm.

Embodiment 84 provides the method of any one of Embodiments 79-83, wherein the first height ranges from about 1.5 times to about 4 times greater than the second height.

Embodiment 85 provides the method of any one of Embodiments 79-84, wherein the first distance ranges from about 1.5 times to about 4 times greater than the second distance.

Embodiment 86 provides the method of any one of Embodiments 51-85, wherein the dielectric layers comprises a dielectric material.

Embodiment 87 provides the method of Embodiment 86, wherein the dielectric material ranges from about 50 wt % to about 100 wt % of the dielectric layer.

Embodiment 88 provides the method of any one of Embodiments 86 or 87, wherein the dielectric material ranges from about 95 wt % to about 100 wt % of the dielectric layer.

Embodiment 89 provides the method of any one of Embodiments 86-88, wherein the dielectric material is chosen from an epoxy laminate, polytetrafluoroethylene, phenolic cotton pater, woven glass, or mixtures thereof.

Embodiment 90 provides the method of any one of Embodiments 86-89, wherein the dielectric layer comprises a plurality of individual layers of the dielectric material.

Embodiment 91 provides the method of Embodiment 90, wherein the individual layers of the dielectric material comprise different dielectric materials.

Embodiment 92 provides the method of Embodiment 90, wherein the first and second layers of the dielectric material comprise the same dielectric material.

Embodiment 93 provides the method of any one of Embodiments 51-92, wherein the copper layer includes elemental copper.

Embodiment 94 provides the method of Embodiment 93, wherein the elemental copper ranges from about 50 wt % to about 100 wt % of the copper layer.

Embodiment 95 provides the method of any one of Embodiments 93-94, wherein the copper ranges from about 95 wt % to about 100 wt % of the copper layer.

Embodiment 96 provides the method of any one of Embodiments 51-95, wherein the copper layer formed in the first patterned region has a substantially non-tapered profile.

Embodiment 97 provides the method of any one of Embodiments 51-96, wherein the method is free of laser drilling.

What is claimed is:

1. A substrate for an integrated circuit, the substrate comprising:
    a dielectric layer; and
    a conductive layer extending in an x or y direction and at least partially embedded within the dielectric layer, the conductive layer comprising:
    a via having a first end and an opposite second end, wherein the via has a first height in a z-direction and a constant cross-sectional shape between the first end and the second end, and the via has a non-tapered profile in the z-direction;
    a capture pad attached to the via having a major diameter equivalent to a major diameter of the via; and
    a trace adjacent to the via and having a second height in the z-direction that is different than the first height, wherein
    the via has a constant width.

2. The substrate of claim 1, wherein the dielectric layer comprises a dielectric material chosen from an epoxy laminate, polytetrafluoroethylene, phenolic cotton pater, woven glass, or mixtures thereof.

3. The substrate of claim 1, wherein the conductive layer comprises copper.

4. The substrate of claim 1, wherein the first height ranges from about 1.5 times to about 4 times greater than the second height.

5. The substrate of claim 1, wherein a width of the via ranges from about 1.5 times to about 4 times greater than a width of the trace.

* * * * *

UNITED STATES PATENT AND TRADEMARK OFFICE
CERTIFICATE OF CORRECTION

PATENT NO. : 10,658,281 B2  
APPLICATION NO. : 15/721321  
DATED : May 19, 2020  
INVENTOR(S) : Manepalli et al.

Page 1 of 1

It is certified that error appears in the above-identified patent and that said Letters Patent is hereby corrected as shown below:

On the Title Page

In item (72), in "Inventors", in Column 1, Line 4, delete "Gilbert," and insert --Chandler,-- therefor Signed and Sealed this  
First Day of December, 2020

Andrei Iancu  
*Director of the United States Patent and Trademark Office*